(12) United States Patent
Laurain et al.

(10) Patent No.: US 11,283,241 B2
(45) Date of Patent: Mar. 22, 2022

(54) PATTERNED METALLIZATION FOR HYBRID METAL-SEMICONDUCTOR MIRROR OF HIGH REFLECTIVITY

(71) Applicant: ARIZONA BOARD OF REGENTS ON BEHALF OF THE UNIVERSITY OF ARIZONA, Tucson, AZ (US)

(72) Inventors: Alexandre Laurain, Tucson, AZ (US); Jerome V. Moloney, Tucson, AZ (US); Patrick Kokou Gbele, Tucson, AZ (US)

(73) Assignee: Arizona Board of Regents on behalf of University of Arizona, Tucson, AZ (US)

( * ) Notice: Subject to any disclaimer, the term of this patent is extended or adjusted under 35 U.S.C. 154(b) by 78 days.

(21) Appl. No.: 16/464,147

(22) PCT Filed: Dec. 7, 2017

(86) PCT No.: PCT/US2017/065087
§ 371 (c)(1),
(2) Date: May 24, 2019

(87) PCT Pub. No.: WO2018/106902
PCT Pub. Date: Jun. 14, 2018

(65) Prior Publication Data
US 2020/0313394 A1    Oct. 1, 2020

Related U.S. Application Data

(60) Provisional application No. 62/431,343, filed on Dec. 7, 2016.

(51) Int. Cl.
| | | |
|---|---|---|
| *H01S 5/183* | (2006.01) | |
| *H01S 5/024* | (2006.01) | |
| *H01S 5/04* | (2006.01) | |
| *H01S 5/14* | (2006.01) | |
| *H01S 5/02* | (2006.01) | |
| *H01S 5/187* | (2006.01) | |
| *H01S 5/343* | (2006.01) | |

(52) U.S. Cl.
CPC ........ *H01S 5/18377* (2013.01); *H01S 5/0216* (2013.01); *H01S 5/02484* (2013.01); *H01S 5/041* (2013.01); *H01S 5/14* (2013.01); *H01S 5/187* (2013.01); *H01S 5/3432* (2013.01)

(58) Field of Classification Search
CPC .... H01S 5/18377; H01S 5/187; H01S 5/0216; H01S 5/02484
See application file for complete search history.

(56) References Cited

U.S. PATENT DOCUMENTS

| | | |
|---|---|---|
| 2003/0127608 A1 | 7/2003 | Shields et al. |
| 2004/0013154 A1 | 1/2004 | Zheng |
| 2005/0243886 A1 | 11/2005 | Wang et al. |
| 2007/0104241 A1 | 5/2007 | Kim et al. |

(Continued)

*Primary Examiner* — Yuanda Zhang
(74) *Attorney, Agent, or Firm* — Quarles & Brady, LLP

(57) ABSTRACT

A reflector for optical devices is disclosed. The reflector includes a distributed Bragg reflector and a metal reflector. The metal reflector is contained within one or more apertures defined by a material having good adhesion to a semiconductor material. A method for bonding the resulting structure to a heat spreader is also disclosed.

13 Claims, 5 Drawing Sheets

(56) References Cited

U.S. PATENT DOCUMENTS

2012/0168793 A1\* 7/2012 Tsang ................ B82Y 10/00
  257/98
2012/0261695 A1\* 10/2012 Chen ................ H01L 33/10
  257/98

\* cited by examiner

FIELD INTENSITY OF LG$_{10}$

MATRIX PATTERN FOR LG$_{10}$

Ti OR Cr MATRIX

METAL REFLECTOR

FIELD INTENSITY OF TEM$_{11}$

MATRIX PATTERN OF TEM$_{11}$

Ti OR Cr MATRIX

METAL REFLECTOR

PATTERNED METALLIZATION FOR HYBRID METAL-SEMICONDUCTOR MIRROR OF HIGH REFLECTIVITY

CROSS-REFERENCE TO RELATED APPLICATION

This application represents the U.S. National Stage of International Application No. PCT/US2017/065087, filed on Dec. 7, 2017, and claims priority to U.S. Provisional Patent Application No. 62/431,343 filed on Dec. 7, 2016, the disclosures of which are incorporated herein by reference.

STATEMENT REGARDING FEDERALLY SPONSORED RESEARCH OR DEVELOPMENT

This invention was made with government support under Grant No. FA9550-14-1-0062 awarded by AFOSR. The government has certain rights in the invention.

TECHNICAL FIELD

The present invention is related to an improved reflector for use in vertical external cavity surface emitting lasers (VECSELs), and in particular, high power VECSELs.

BACKGROUND

A VECSEL is a vertical cavity surface emitting laser in which one reflector that defines the resonant cavity is spaced-apart from the gain medium. VECSELs continue to be important in applications requiring the generation of relatively high brightness laser light in a small physical package, with selected functionalities such as single frequency operation, wavelength tunability, or modelocked ultrashort pulse generation. Such applications include spectroscopy, microwave and THz photonics, medical applications such as tissue analysis and telecommunications. The development of VECSEL has seen tremendous progress in recent years, including improvements in output power, coherence, wavelength tunability, and modelocked performance.

For a conventional VECSEL device, the gain medium is typically thin resulting in relatively low intrinsic gain. This necessitates the use of highly reflective mirrors having typical reflectances exceeding 99.9% to define the resonant cavity. These mirrors are typically realized with a semiconductor distributed Bragg reflector (DBR)—a stack of layers of material alternating the refractive index, with each layer in the stack having an optical thickness of one quarter wavelength at the desired laser output center wavelength. In order to achieve high reflectivity with a reasonably small number of DBR layers, the use of materials having a large difference in indices of refraction is ideal. However, the semiconductor materials used in the DBR must be lattice matched to the material of the gain medium, which limits the available materials for the DBR and thus the refractive index contrast achievable.

The best performances in terms of power and efficiency have been reported with VECSEL grown on gallium arsenide (GaAs) substrate for an emission wavelength between 900 nm and 1100 nm. In this wavelength range, 28 pairs of AlGaAs/AlAs are required to reach a reflectivity greater than 99.9%. At longer wavelengths, the system material must be changed, typically to Indium phosphide (InP)-based materials for an emitted wavelength between 1.31 µm and 1.6 µm, or to GaSb-based material for the 2 to 3 µm range. Even though InP-based materials have a high optical gain, the low contrast in refractive index of the InP-based DBR materials requires the use of a large number of pairs, typically over 40.

The use of thick stacks of semiconductor materials to realize the reflector has several disadvantages. In addition to requiring many process steps, the resulting conventional DBRs have poor thermal conductivity, both due to the material itself and the total thickness of the stack, which increases with the laser wavelength. Even at shorter wavelengths, e.g., 1 µm, it has been shown that the DBR is a main limiting factor in term of overall laser power, as it accounts for about 50% of the total thermal impedance of the VECSEL for a typical 100 µm pump spot radius. Additionally, the index contrast for available semiconductor materials limits the spectral bandwidth of the mirror (stop-band). While metallic mirrors offer wide spectral bandwidth, they typically have relatively low reflectivity (i.e., less than 99%). Suitable high-reflectivity metals also do not adhere well to semiconductors, particularly over the temperature ranges experienced by high power VECSEL devices.

SUMMARY

Embodiments of the invention are directed to a VECSEL having a hybrid metal-semiconductor mirror, consisting of a half sized DBR and a metal reflector of high reflectivity, such as gold. The metal reflector is deposited over the phase matching layer terminating the DBR structure of the semiconductor chip through apertures defined by a patterned mask or matrix. The matrix is formed of a material having good adherence to the semiconductor material of the DBR. In certain embodiments the matrix is formed of titanium, and the reflector is formed of pure gold. In one embodiment, the gold reflector is deposited as a continuous layer onto the back side of the titanium mask, such that it adheres to both the back side of the titanium mask and the DBR through the apertures defined by the titanium mask.

Other embodiments of the invention are directed to a method of bonding a hybrid metal-semiconductor mirror to a heat spreader. Devices according to certain embodiments include a first metal layer (e.g., gold) deposited onto a DBR, a second metal layer (e.g., platinum) acting as a diffusion barrier deposited on a back side of the first metal layer, a layer of gold deposited onto a back side of the diffusion barrier, and a layer of indium deposited on a back side of the gold layer to bond the structure to a heat spreader.

In one embodiment, the invention includes a laser device having a first reflector, a semiconductor gain medium, a distributed Bragg reflector and a first metal layer in direct contact with the distributed Bragg reflector. The first metal layer including a reflective metal having a reflectance of greater than 97% at a predetermined wavelength. The laser device also includes a second metal layer in direct contact with the first metal layer, a third metal layer in direct contact with the second metal layer, a layer of indium in direct contact with the third metal layer and a heat spreader in thermal contact with the layer of indium.

In another embodiment, the invention includes a reflector for an optical device. The reflector has a distributed Bragg reflector and metal matrix having a front side in direct contact with the distributed Bragg reflector. The metal matrix has one or more apertures, and a layer of reflective metal having a reflectance of greater than 97% at a predetermined wavelength at normal incidence is in direct contact with the distributed Bragg reflector through the apertures.

In another embodiment, the invention includes a laser device incorporating the reflector described above.

In yet another embodiment, the invention includes a method of fabricating a reflector for an optical device. The method includes the steps of, on a semiconductor substrate, forming a distributed Bragg reflector. On the distributed Bragg reflector, forming a metal matrix defining apertures, and on the distributed Bragg reflector, through the apertures, forming a layer of reflective metal having a reflectance of 97% at a predetermined wavelength.

Embodiments of the invention have certain advantages over conventional VECSEL reflectors. First, the use of metal reflector in conjunction with a DBR allows for greater than 99.9% reflectivity to be achieved with a much thinner DBR structure, e.g., 14 layers instead of 28 or more used in conventional DBR-only reflectors. The reduction of the DBR thickness results in a reduced thermal impedance for the reflector, which enables the device to operate at higher power levels with improved output power efficiency. The incorporation of a metal layer into the reflector also reduces the mirror's electrical impedance, which is advantageous for electrically pumped VECSELs or VCSELs. Second, using a metallic mirror increases the overall spectral bandwidth of the mirror (i.e., the stop-band), and allows pump light to be recycled back through the gain medium. This is a particularly helpful advantage given the small thickness and consequent partial pump absorption and low intrinsic gain of VECSEL devices. In test devices fabricated according to embodiments of the invention, a higher gain was observed on areas metalized with pure gold, and output powers above 4 W around 1050 nm were obtained with an rms fluctuation <1% over 1 hour of operation on an GaAs-based device.

Third, by depositing the highly reflective metallic layer (e.g., a gold layer) onto a back side of a titanium mask, and also into apertures defined by the titanium mask, such that the reflective layer is on the areas to be pumped, the problem with poor adhesion of gold to the semiconductor material is circumvented, and good adhesion occurs over the range of operating temperatures experienced by a high power VECSEL device. Fourth, the use of titanium for the mask or matrix material has the additional benefit of providing a low reflectivity region outside the designed apertures, which can be exploited to discriminate the high order transverse modes of the laser cavity. Finally, by depositing a metallic diffusion barrier layer on the back side of the gold layer, followed by another gold layer, an indium layer can be used to bond the entire structure to a heat spreader without risk of indium-gold inter-diffusion lowering the reflectivity of the gold reflector layer. This results in better ability to extract heat from the relatively thin hybrid-reflector, which again, produces a durable device capable of operation at high output power.

BRIEF DESCRIPTION OF THE DRAWINGS

The following disclosure will be better understood in reference to the following accompanying generally not-to-scale Drawings, of which.

Generally, the sizes and relative scales of elements in Drawings may be set to be different from actual ones to appropriately facilitate simplicity, clarity, and understanding of the Drawings. For the same reason, not all elements present in one Drawing may necessarily be shown in another.

DETAILED DESCRIPTION

In accordance with examples of embodiments of the present invention, methods and apparatus are disclosed for providing a hybrid metal-DBR reflector for high powered lasers, which greatly reduces the thickness of the reflector over conventional DBRs, while solving the adhesion problem present in conventional solutions. Additionally, systems and methods are disclosed which enable durable bonding of the resultant structure to a heat spreader without risk of indium diffusion lowering the reflectivity of the metal reflector.

Figure 1:
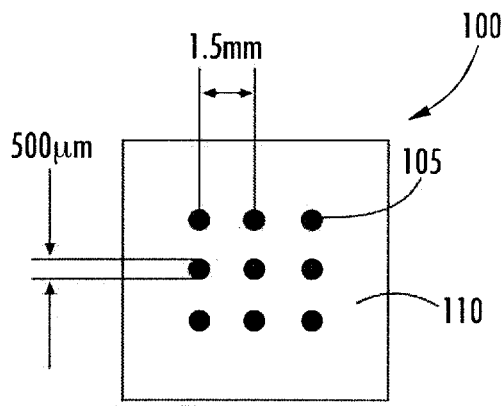
FIG. 1 is a top schematic view of a hybrid medal-semiconductor mirror according to an embodiment of the invention.
Figure 7:
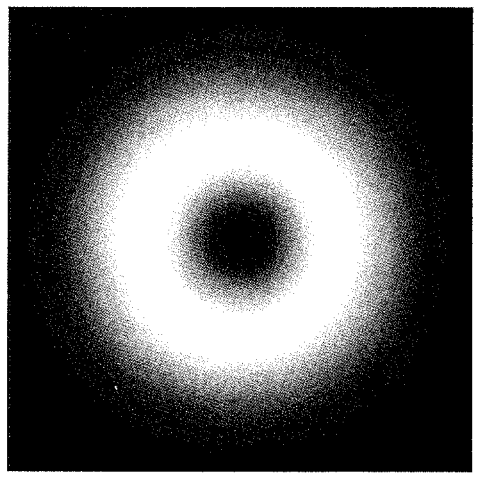
FIG. 7 is a top down view of additional reflector patterns usable in accordance with embodiments of the invention and the field intensities of associated transverse modes supported by those reflectors.
Figure 7:
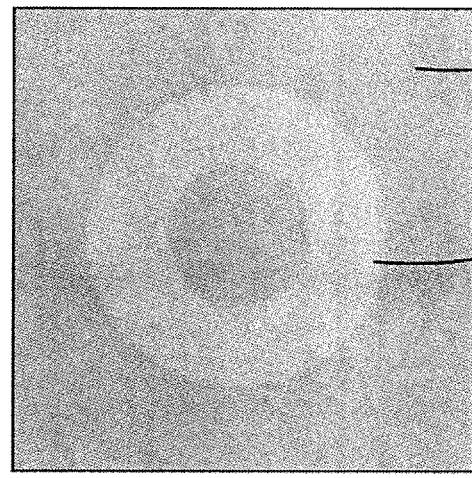
Figure 7:
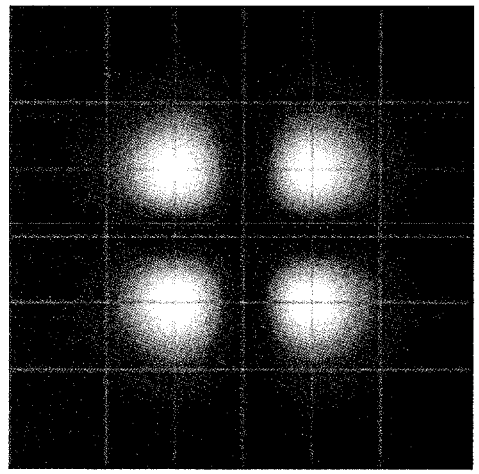
Figure 7:
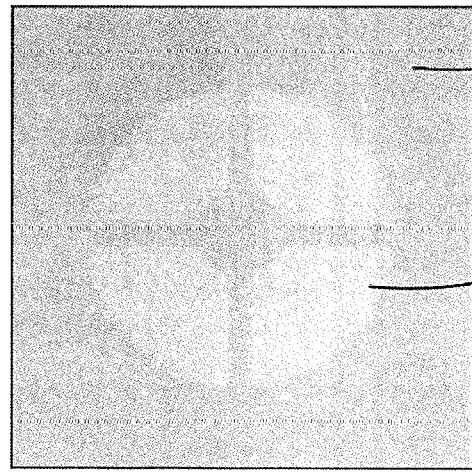

Referring to FIG. 1, there is shown a top down schematic view of a metal-DBR hybrid reflector 100. The reflector consists of a titanium mask or matrix 110 deposited directly onto a semiconductor substrate, and specifically, on a phase matching layer, which is the last layer in a DBR. In the embodiment of FIG. 1, the titanium mask 110 defines circular apertures, resulting in circular reflectors that support laser emission in the lowest order transverse mode (i.e., TEM00). Other aperture shapes, some of which are described below in reference to FIG. 7, are possible and within the scope of the invention, and may be usable to support other laser modes. Apertures 105, which in the example of FIG. 1, are located on a square grid having 1.5 mm centers. Each aperture 105 has a diameter of 500 µm, and is sized to slightly overfill an active gain region (e.g., a quantum wells) that lies below the aperture on the other side of the DBR. The final layer of the DBR, a phase shifting layer, is exposed by apertures 105, and during subsequent processing steps, set forth in additional detail in FIGS. 2 and 3, apertures 105 are filled with a metal layer having a reflectivity of greater than 97% in the wavelength of interest (E.g., in the 700-1100 nm region). One such suitable metal is gold. In addition to filling apertures 105, the gold layer is also deposited on the back side of the titanium mask 110.

Figure 2:
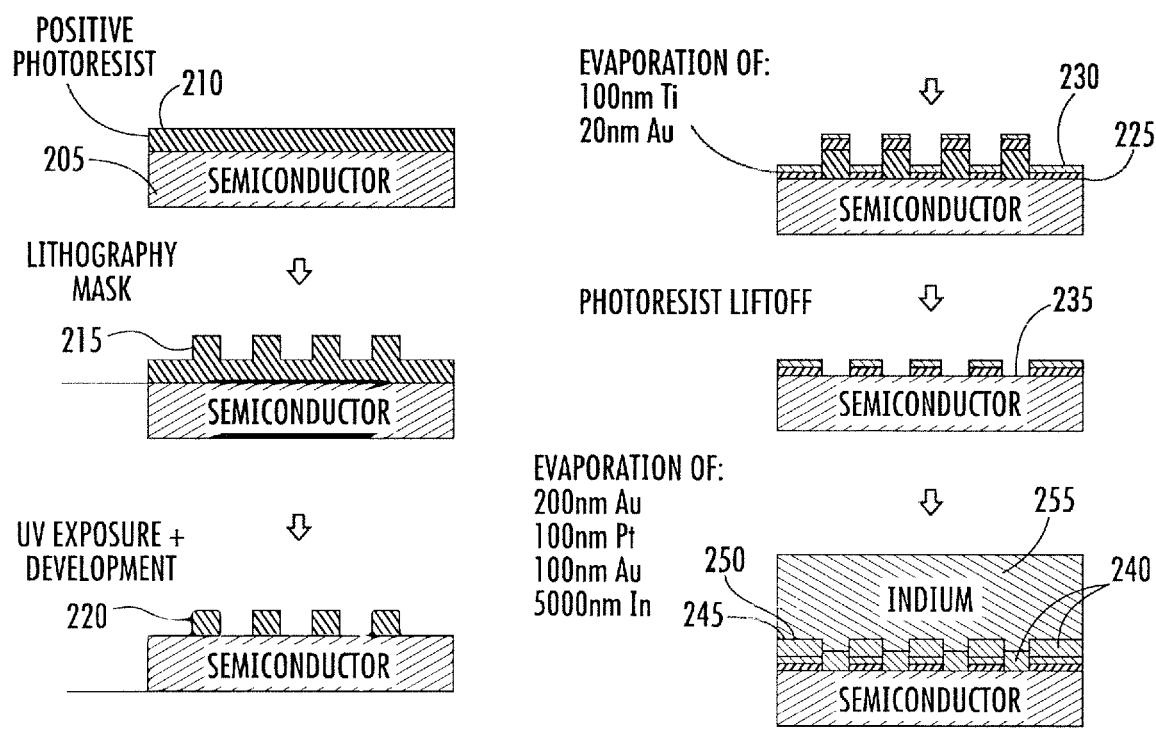
FIG. 2 is a series of schematic cross sectional views of a hybrid metal-semiconductor mirror according to an embodiment of the invention illustrating fabrication process steps.

FIG. 2 schematically illustrates, in cross section, the processing steps for fabricating a metal-DBR hybrid mirror on a VECSEL according to an exemplary embodiment. As is illustrated in FIG. 2, first a semiconductor substrate 205 (in one example, GaAs) is provided. While the semiconductor substrate illustrated in FIG. 2 is pictured as monolithic, in practice, the semiconductor material includes both the semiconductor gain medium and the layers of a thin DBR. This structure is illustrated in additional detail in the detailed cross section of FIG. 5.

Next, a positive photoresist layer 210 is deposited onto the semiconductor substrate 205. Next, the positive photoresist is exposed (illustrated as 215) through a photolithography mask having the geometry illustrated above to FIG. 1. After a subsequent etching step, the result is circular spots of positive photoresist 220, spaced by 1.5 mm with a diameter of 500 μm, which are deposited on the semiconductor DBR 205. Next, the structure is metalized with 100 nm of titanium 225 and 20 nm of gold 230 through an evaporation process. The 20 nm of gold prevents the oxidation of titanium during the next step. The photoresist 220 is then lifted with a chemical stripper, leaving the circular spots 235 of the semiconductor exposed during the next evaporation step, during which is deposited 200 nm of gold 240, followed by 100 nm of platinum 245 and 100 nm of gold 250. Finally, the structure is metallized with a 5 microns thick indium layer 255 for subsequent bonding onto a high thermal conductivity heat spreader like a CVD diamond.

In the resulting structure, on the circular spots 235, the semiconductor 205 is in contact with pure gold, forming the highly reflective hybrid-mirror. In the area outside of the circular apertures 235, the remaining semiconductor surface area is in direct contact with titanium which has a much stronger bond with GaAs, which ensures a good adhesion of the deposited metal film. This occurs because the circular gold spots within the titanium apertures 250 are supported from the sides by the titanium matrix, as well as the portion of gold layer 240 that is deposited onto the thin 20 nm gold layer 230, which is deposited onto the titanium layer 225. The portion of layer 240 that overlays the thin gold layer 230 and the titanium layer 225 benefits from strong gold to titanium adhesion outside of the circular regions 235, which helps "tack" the circular gold portions into place on the semiconductor substrate 205. Additionally, in the final structure, the circular gold reflector portions of layer 240 are completely encapsulated and embedded in the additional layers, which helps the gold adhere to the semiconductor. The Platinum layer 245, which is deposited both over the titanium layer and the circular spots, acts as a barrier to prevent the indium solder 255 from interdiffusing with the 200 nm gold layer 240, which would decrease the reflectivity over time. The last 100 nm of gold 250 ensures an excellent adhesion with the indium solder.

Figure 3:
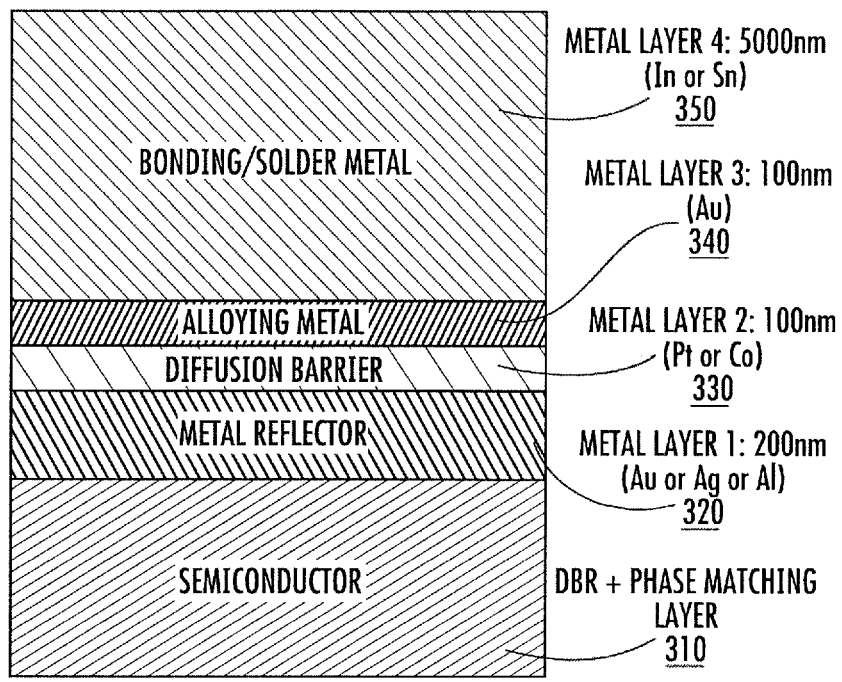
FIG. 3 is a schematic view of the reflector layers formed by the processing steps illustrated in FIG. 2 in more detail.

FIG. 3 is a schematic illustration of the final material stack in the region of the metal reflectors or apertures. As can be seen in FIG. 3, the structure starts with a layer 310, including both the DBR itself and a phase matching layer. On top of this layer 310 is the metal reflector layer 320, which can be any highly reflective metal (e.g., greater than 97% reflectivity for the wavelength of interest). Exemplary metals that may be used are gold, silver and aluminum. On top of the metal reflector 320 is the diffusion barrier 330 (for example, platinum or cobalt), followed by a thin gold layer (metal layer 340), and followed by indium or tin solder (metal layer 350). In the region outside of the area of the apertures (i.e., outside of the area of the reflectors), the stack is the same, except there is a layer of titanium or some other strongly adherent metal (e.g., chromium) as well as a thin layer of non-oxidative material (e.g., gold) between the DBR and Metal Layer 1 (metal reflector layer 320) in FIG. 3.

Figure 4:
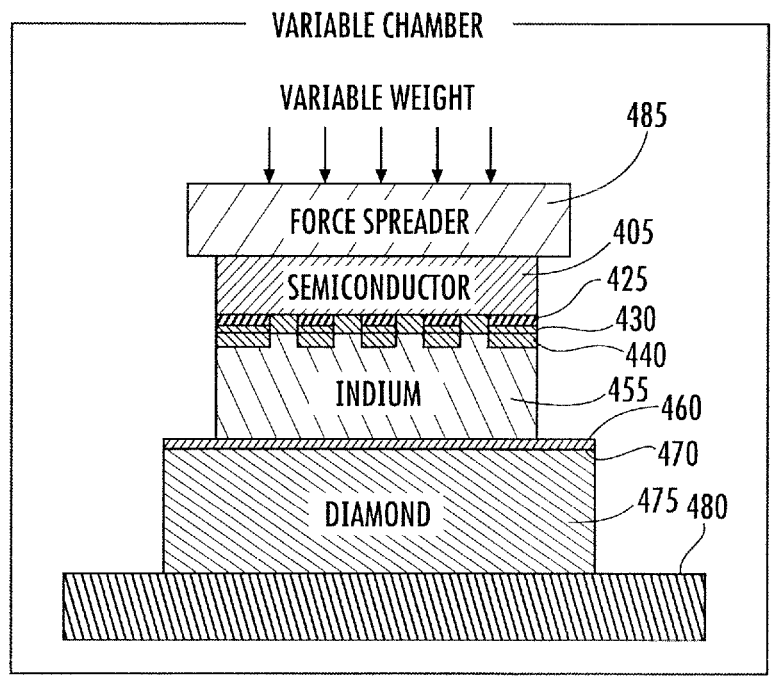
FIG. 4 is a schematic cross-sectional view of a VECSEL bonded to a heat spreader according to an embodiment of the invention.

In certain embodiments, after the patterned metallization set forth above with respect to FIG. 2, the semiconductor is soldered to a CVD diamond heat spreader, or other heat spreading material, which is then thermally connected to a non-illustrated heat-sink. An arrangement for accomplishing this as well as a schematic depiction of the structure is shown in FIG. 4. According to the arrangement of FIG. 4, the diamond 475 is metallized with a 100 nm titanium layer 470 followed by a 100 nm gold layer 460. Then, the semiconductor chip, including the metalized structure described in FIG. 2 (i.e., semiconductor substrate 405, titanium mask 425, gold layers 430, 440, indium solder 455, etc.) and the diamond 475 are held together in a vacuum chamber while applying a uniformly distributed force on the chip via force spreader 485. The substrate temperature is gradually increased to 200° C. over a 10 min span, by heating from hot plate 480, and decreased to room temperature over a 20 min span. Afterward, excess, extraneous material from the semiconductor substrate 405 (in one embodiment, GaAs) is removed by selective wet etching.

The processing technique set forth above provides a reflectivity of >99.95% on the gold spots at a wavelength of 1000 nm. This reflectivity is accomplished with only 12 pairs of quarter wavelength AlAs/AlGaAs layers, whereas a stand-alone semiconductor DBR would require 24 pairs to reach a similar reflectivity. When a thermal stress is applied to the structure, for example by the absorption of an intense laser beam or by the excitation with a strong electrical current, the surrounding area metallized with Titanium keeps the semiconductor structure in contact with the gold layer, preserving the integrity of the gold reflector. This concept of tacking a small reflective area to a semiconductor structure using a surrounding metal matrix has particular application in high power, solid state lasers. For example, metal-DBR hybrid reflectors can be integrated in a VECSEL as a bottom reflector, where the inherent low gain requires highly reflective mirrors. In the case of an optically pumped VECSEL, a gold reflector is even more advantageous as it may be used to reflect the pump wavelength in addition to the lasing wavelength. By recycling the pump light in this manner, the efficiency of the laser is increased, which allows a design of the gain medium with a shorter absorbing region, which is critical for ultra-short pulse generation.

Figure 5:
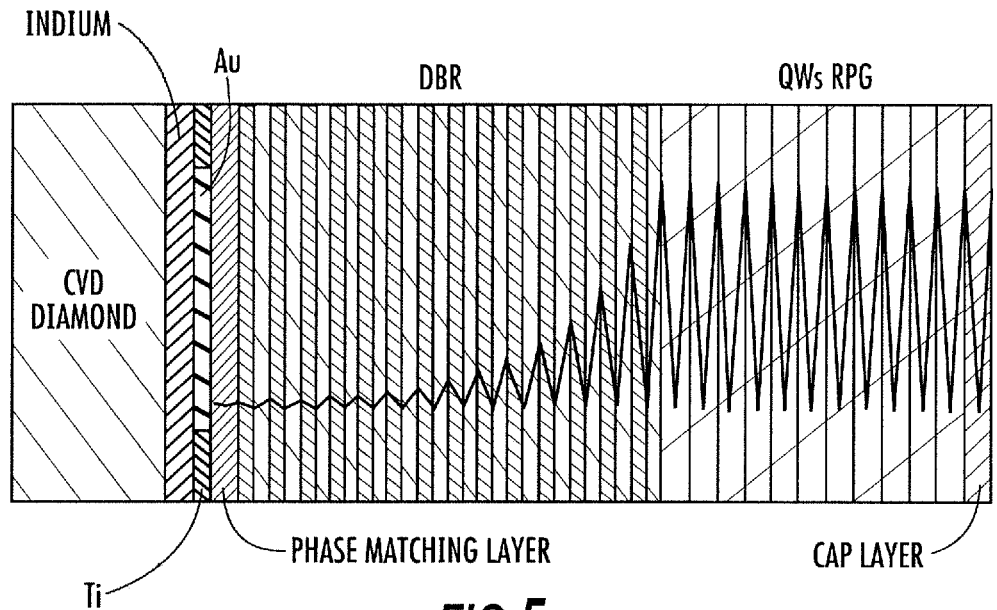
FIG. 5 is a schematic cross sectional view of portions of a VECSEL according to an embodiment of the invention.

Portions of such a device are depicted schematically in FIG. 5 along with an indication of optical field strength within the device. FIG. 5 depicts a VECSEL without the external reflector ("top" reflector) or an optical pump source, which components are described below in reference to FIG. 6. The device of FIG. 5 includes a cap layer to confine the excited carriers in the active region. Next to the cap layer is the active gain region, the quantum well resonant periodic gain (RPG) region. Next to the QWs RPG region is the DBR, which in the embodiment of FIG. 5 contains only 14 pairs of quarter wave thick layers. In one example, where the gain medium is composed of 10 InGaAs quantum wells, the DBR is formed of alternating AlAs/AlGaAs layers having quarter wave optical thickness at the designed emission wavelength of 1057 nm, which are also transparent at the designed pump wavelength of 808 nm. To account for the phase shift that will occur upon reflection from the metal portion of the reflector, a phase matching layer is added to complete the DBR. In direct contact with the DBR, and in one example, in direct contact with the DBR's phase matching layer, is a metal reflector, formed, according to the discussion above, by deposition of a titanium matrix defining one or more apertures, into which is deposited gold reflectors. As is set forth above, the gold layer may overflow the apertures and also be deposited, during a single or multiple deposition steps, onto a back side of the titanium layer. Optionally, platinum may be added to a back side of this gold layer, followed by an additional gold layer, followed by indium solder, which bonds the structure to a heat spreader, e.g., CVD diamond.

Figure 6:
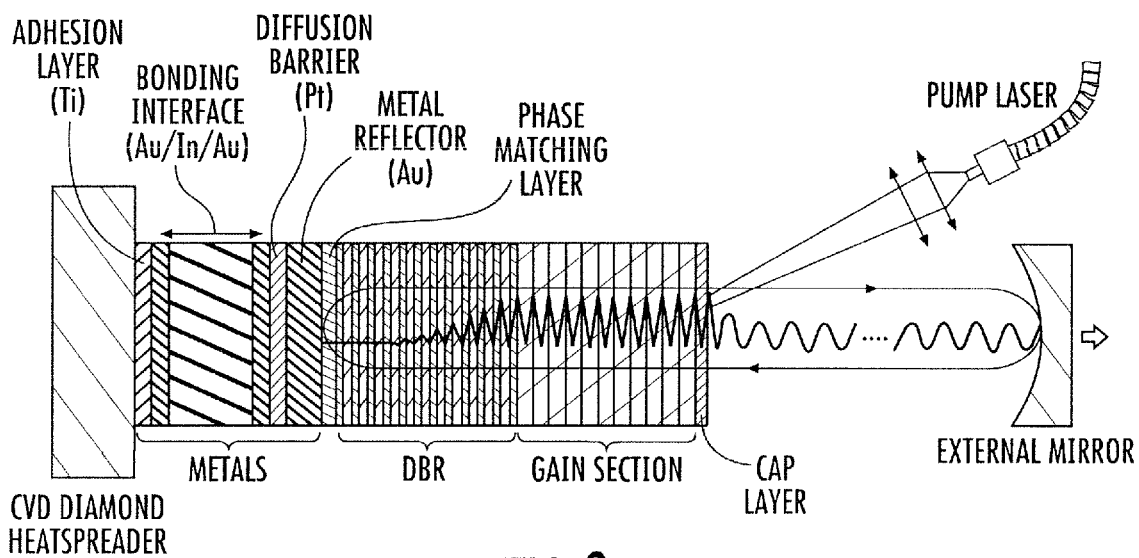
FIG. 6 is a schematic illustration of a VECSEL according to an embodiment of the invention.

FIG. 6 schematically illustrates a full VECSEL incorporating the components described in FIG. 6. In the example of FIG. 6, a laser includes a pump source, an external or "top" mirror, and the laser gain section. Next to the laser gain section is the DBR. A metallic reflector is deposited on the phase matching layer of the DBR, which according to the discussion above, is encapsulated in a matrix of a well-adhering material like titanium. A diffusion barrier (e.g., platinum) is on a back side of the reflective metal, followed by gold, indium, another layer of gold, a material with good adherence to semiconductors or dielectrics like titanium, and finally a head spreader like CVD diamond.

One of the improvements provided by the hybrid-DBR is the increased reflectivity bandwidth around the signal wavelength, as it takes advantage of the very broadband reflectivity of gold. For example, when compared to a standard full size 24 pairs DBR, the bandwidth at which the reflectivity is above 99.9% is increased by more than 23%. This provides a major improvement as the tunability range of a laser may be limited by the stopband and a broader range may allow for a shorter pulse generation in a modelocked VECSEL.

Figure 8:
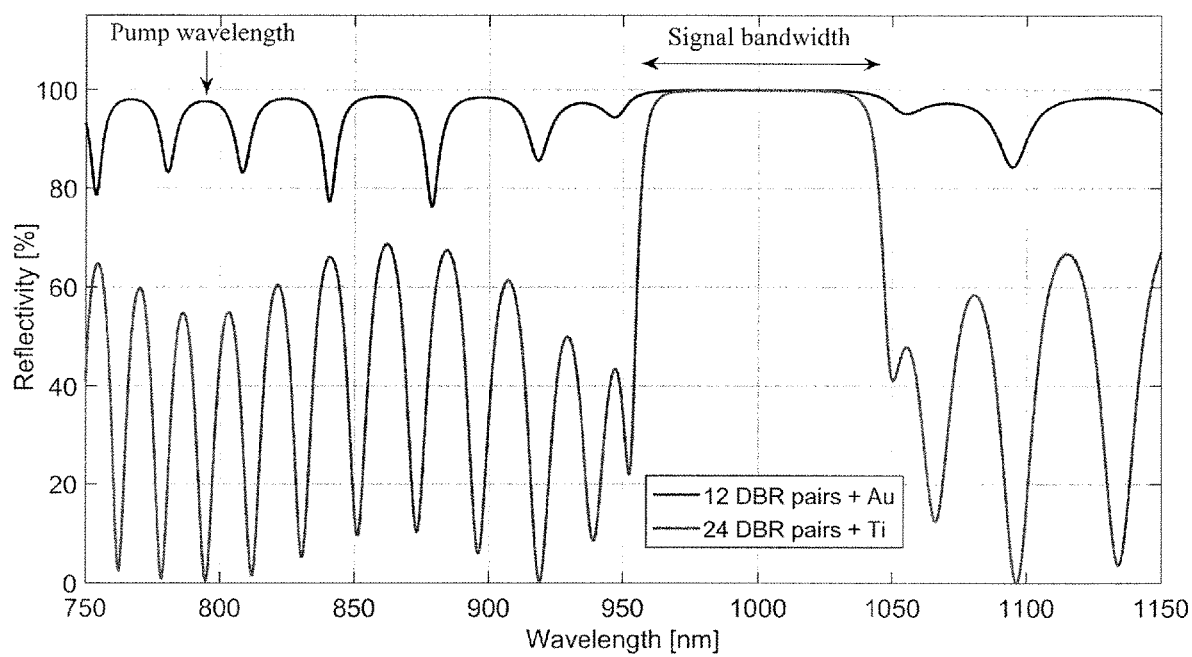
FIG. 8 is a reflectivity spectrum simulation of a VECSEL structure comparing a standard 24 pairs DBR with a hybrid mirror.

The reflectivity outside the DBR stop-band FIG. 8 is also enhanced and exhibits broader interference fringes. A broader and higher reflectivity at shorter wavelengths may be fully exploited to reflect a pump wavelength with a large acceptance wavelength and angle. FIG. 8 shows a reflectivity spectrum simulation of a VECSEL structure comparing a standard 24 pairs DBR with a hybrid mirror.

Additionally, a shorter DBR also leads to a lower thermal impedance of the device since semiconductor materials have a poor thermal conductivity compared to metals and diamond. For example, a thermal impedance decrease >30% is expected in a hybrid-DBR VECSEL structure of the current invention, when compared to a full size DBR structure.

While the examples set forth above are based on GaAs-based systems, the invention is not so limited. Hybrid mirrors and the metal-to-indium bonding methods of embodiments of the invention may be used with other semiconductors such as InP or GaSb for improved performances at other wavelengths (telecom bands, mid-infrared, etc.). Moreover, while the examples above use gold as the metal reflector, any metal having greater than 97% reflectivity at a predetermined design wavelength would be acceptable, including, for example, silver or aluminum. Additionally, while the mask or matrix described in reference to the examples above is titanium, other materials with good adhesion to semiconductor materials, such as chromium, would be acceptable. Also, while the heat spreader described above is CVD diamond, other heat spreader materials, e.g., sapphire, glass, or semiconductor materials, are also acceptable for certain applications. Finally, while the metal-DBR hybrid reflector embodiments have been described as having particular advantages when used as VECSEL bottom reflectors, such structures have other applications in optics as well, for example, as reflectors for other solid-state laser architectures or for optical telecommunications applications. For example, a hybrid DBR according to the invention could be used as a saturable absorber mirror (SESAM) for the modelocking of numerous high power laser architectures (fiber, solid state, semiconductor). In such an application, one or multiple QWs would be arranged in front of the DBR (in place of the gain region in the laser architectures described above). The improved bandwidth and reduced thermal impedance of the inventive reflection would be a clear advantage for short pulse generation.

Additionally, while the exemplary reflector described above, and depicted specifically in FIG. 1, includes a matrix of multiple reflective areas arranged over a single gain region, this is not a requirement. While the arrangement of FIG. 1 may be used with a single gain region and with a pump beam that overfills the overall region of the reflectors, an alternative arrangement is contemplated and within the scope of the invention in which each reflector forms its own, separate and independent resonant cavity with one or more external top mirrors and each of these separate regions is pumped separately.

Moreover, while the metal reflectors have been described herein as circular, this is not a requirement. The matrix pattern (and the resultant reflectors) can be designed to select a chosen transverse mode distribution. In these embodiments, the shape of the matrix is adjusted to the field distribution of the mode selected, to ensure a high reflectivity at the field maxima and a low reflectivity at the field minima. The transverse mode discrimination is provided by the lower spatial overlap of the other modes with the highly reflective area, and by the lower pump reflection on the matrix. Exemplary matrix patterns for the selection of a Laguerre-Gauss mode LG01 and for a Hermite-Gauss mode TEM11 are given in FIG. 7. The generation of a single high order LG mode is particularly interesting as it can carry an orbital angular momentum. Such optical vortex beams are generating a growing interest due to their potential applications such as: optical handling of microscopic particles (optical tweezer), microscopy overcoming the Rayleigh criterion, laser material processing, quantum information processing and telecommunication.

While the invention is described through the above-described exemplary embodiments, of which greater detail is provided in Appendix A, it will be understood by those of ordinary skill in the art that modifications to, and variations of, the illustrated embodiments may be made without departing from the inventive concepts disclosed herein. Accordingly, the invention should not be viewed as being limited to the disclosed embodiment(s).

What is claimed is:

1. A reflector for an optical device, comprising:
a distributed Bragg reflector:
a metal matrix having a front side in direct contact with the distributed Bragg reflector, the metal matrix defining one or more apertures; and
a layer of reflective metal having a reflectance of greater than 97% at a predetermined wavelength at normal incidence in direct contact with the distributed Bragg reflector through the apertures;
wherein the metal matrix has a back side, and wherein the layer of reflective metal also directly contacts the back side of the metal matrix outside of the area of the apertures.

2. The reflector of claim 1, wherein the layer of reflective metal is gold.

3. The reflector of claim 1, wherein the reflective metal is selected from the group of silver and aluminum.

4. The reflector of claim 1, wherein the metal matrix is titanium or chromium.

5. The reflector of claim 1, wherein the distributed Bragg reflector includes a phase matching layer with which the metal matrix and the layer of reflective metal make contact.

6. The reflector of claim 1, further comprising a layer of platinum in direct contact with a back side of the reflective metal.

7. The reflector of claim 6, wherein the layer of platinum has a back side, and wherein the reflector includes a layer of gold in direct contact with the layer of indium.

8. The reflector of claim 7, further comprising a heat spreader in direct contact with the layer of indium.

9. The device of claim 1, wherein the material of the metal matrix has a reflectance of less than 62% at the predetermined wavelength at normal incidence.

10. A method of fabricating a reflector for an optical device, the method comprising;
   on a semiconductor substrate, forming a distributed Bragg reflector in
   contact with the semiconductor substrate;
   on the distributed Bragg reflector, forming a metal matrix defining a plurality of apertures: and
   on the distributed Bragg reflector in the area of the apertures, forming a layer of reflective metal having a reflectance of 97% at a predetermined wavelength.

11. The method of claim 10, wherein the reflective metal is gold and the metal matrix is titanium.

12. The method of claim 10, further comprising forming, on a back side of the layer of reflective metal a layer of platinum, a layer of gold, and a layer of indium.

13. A reflector for an optical device, comprising:
   a distributed Bragg reflector having a continuous planar rear side:
   a metal matrix having a planar front side in direct contact with the continuous planar rear side of the distributed Bragg reflector, the metal matrix defining one or more apertures; and
   a layer of reflective metal in direct contact with the distributed Bragg reflector through the apertures.

* * * * *